United States Patent [19]

Harp et al.

[11] 3,931,587
[45] Jan. 6, 1976

[54] MICROWAVE POWER ACCUMULATOR

[75] Inventors: Robert S. Harp, West Lake Village; Harry L. Stover, Newberry Park, both of Calif.

[73] Assignee: Hughes Aircraft Company, Culver City, Calif.

[22] Filed: Feb. 3, 1975

[21] Appl. No.: 546,230

Related U.S. Application Data

[63] Continuation of Ser. No. 324,938, Jan. 19, 1973, abandoned.

[52] U.S. Cl. ............... 331/56; 330/34; 331/101; 331/107 R
[51] Int. Cl.² .................................... H03B 7/14
[58] Field of Search ...... 331/56, 101, 107 R, 107 T; 330/34

[56] References Cited
UNITED STATES PATENTS

| | | | |
|---|---|---|---|
| 3,378,789 | 4/1968 | Gerlach | 331/107 |
| 3,445,778 | 5/1969 | Gerlach | 330/43 |
| 3,521,194 | 7/1970 | Lowe | 331/101 |
| 3,628,171 | 12/1971 | Kurokawa et al. | 331/56 |
| 3,733,560 | 5/1973 | Oltman, Jr. et al. | 330/56 |

FOREIGN PATENTS OR APPLICATIONS

| | | |
|---|---|---|
| 1,234,864 | 6/1971 | United Kingdom |

*Primary Examiner*—John Kominski
*Attorney, Agent, or Firm*—William J. Bethurum; W. H. MacAllister

[57] ABSTRACT

Disclosed is a microwave power accumulator including a plurality of coaxial oscillator circuits, each tightly coupled to a single common output combining resonant cavity. Each of the coaxial circuits includes a negative resistance diode at one end and a lossy terminating (microwave absorbing) material at the other end which absorbs and suppresses resonant modes within each coaxial circuit. This feature enables the cavity resonance of the common output combining cavity to dominate all of the individual coaxial circuits spaced therearound. The spacing of these coaxial circuit modules around a common cylindrical output combining cavity permits a high packing density and good individual heat sinking for the accumulator.

15 Claims, 4 Drawing Figures

MICROWAVE POWER ACCUMULATOR

This is a continuation of application Ser. No. 324,938, filed Jan. 19, 1973 and now abandoned.

FIELD OF THE INVENTION

This invention relates generally to microwave power sources and more particularly to an improved microwave power accumulator which uniquely combines a plurality of individual coaxial modules with a common cylindrical resonant cavity.

BACKGROUND

Over the past several years, the development of solid state microwave power sources has advanced rapidly; these sources now demonstrate excellent performance, reliability and durability in many applications requiring modest power levels. At the present time, however, power levels above a few watts at X-band (and proportional power levels at other frequencies) are the exclusive domain of electron tubes. It is obviously desirable to increase the power levels obtainable from solid state sources in order to realize their advantageous features in a broader range of applications. Since there are fundamental factors that limit the power obtainable from individual devices, a present approach to increasing microwave power levels is to combine or accumulate the power from a multiplicity of discrete devices. Generally, there are two ways in which this can be done, and these involve power accumulation at the device level and at the circuit level, respectively.

PRIOR ART

One prior technique for accumulating power at the device level involves mounting several solid state microwave diodes, such as IMPATTS or TRAPATTS, on a common heat sink and connecting these devices in series or parallel. By arranging these devices in clusters on a common electrically-insulating heat sink of a material with a high thermal conductivity, such as type IIA diamond, a high thermal conductivity from these devices can be obtained. At the same time a relatively high output power and a high source impedance can be maintained for this series connection. Approximately ten watts output at X-band have been obtained at this device accumulation level. A parallel connection of many diodes inserted in this manner can result in a desirable high thermal conductivity. But this connection is electrically equivalent to a single device with area equal to the sum of the areas for the individual devices, and hence generally results in an undesirably low impedance level.

At the circuit level, several approaches have been tried in attempts to accumulate power from a number of separate microwave diode sources. One of these approaches involves coupling a plurality of diode oscillators, respectively, to a plurality of serially cascaded microwave circulators. A signal is fed into the input one of the series connected circulators, and an amplified output signal is derived from the last circulator in the series connection. While this circuit technique may be used to increase power levels from input to output signal, the primary reason for using this particular connection is to increase the linear gain of the input signal. This approach is limited by the power handling capability of the last or output circulator of the above cascaded circulator connection.

Another prior circuit approach for increasing microwave power levels utilizes a so-called waveguide "tree" configuration wherein individual pairs of microwave oscillators form the lowest power level of the configuration and have their outputs combined in a next higher level of the waveguide tree structure. Then the combined outputs at this latter power level are further combined with other like outputs in successively higher power levels, until reaching a single waveguide output for the tree configuration. While this technique serves to provide relatively high output microwave power levels, the above-described waveguide combining structure is very bulky, lossy, and inefficient in the transmission of microwave power.

A third prior approach for accumulating microwave power at the circuit level involves mounting a plurality of diodes at spaced positions around a large elliptical waveguide cavity into which separate input and output coaxial lines feed at the two foci of the cavity, respectively. An input signal which is fed into the input coaxial line provides injection locking for the plurality of diodes, and the microwave energies propogated from each of these diodes are reflected from the vertical walls of the elliptical cavity and arrive substantially in phase at one (output) foci of the cavity. The disadvantage of this prior structure is that there is some interaction between the microwaves emanating from adjacent diodes, and such interaction has the effect of altering the phase of adjacent microwaves propagated in the elliptical cavity. This causes the energies propagated along separate paths of the elliptical cavity to arrive out of phase at the output foci and therefore not be totally additive. Furthermore, the above elliptical cavity structure produces undesirable resonant modes of oscillation during its operation.

A fourth prior circuit approach utilizes a plurality of coaxial oscillator circuits, each spaced predetermined distances apart along the walls of a rectangularly shaped combining cavity resonator. Power from the individual coaxial oscillator circuits is combined in the common central cavity resonator. Such a power accumulation scheme is described, for example, by Kurokawa et al, *Proceedings of the IEEE*, January 1971, pages 102–103. A disadvantage with this latter approach resides in the criticality of the spacing of the individual oscillator circuits along the walls of the rectangular combining cavity in order to achieve proper single frequency CW operation. A further disadvantage of the latter approach is that a large rectangular resonant cavity is required. The number of resonant modes increases with the volume of the cavity, and the volume of the Kurokawa et al rectangular cavity is quite large. These undesirable resonant modes will not properly couple to all of the diodes in the power combining structure, resulting in spurious modes of oscillation under certain conditions. A further disadvantage of the above Kurokawa et al scheme is that the diodes placed close to the output port of this structure see stronger fields than those further removed from the output of the structure.

THE INVENTION

The general purpose of this invention is to provide a novel alternative approach to the above prior art approaches. The present invention possesses most, if not all, of the advantages of these prior art power accumulation schemes, while possessing none of their aforedescribed disadvantages. To attain this purpose, a coaxial oscillator structure is provided wherein a plurality of individual coaxial oscillator circuits (modules) are selectively spaced within the structure and around a common cylindrical output combining resonant cavity which tightly couples to each coaxial circuit. Each of these coaxial circuits is provided with a negative resistance microwave diode element at one end for sustaining microwave oscillations in the frequency band of interest. A lossy terminating element of predetermined geometry is spaced a chosen distance within the circuit from the microwave diode to provide suppression of undesirable resonances therein. The combining cavity presents each diode in the above oscillator circuits with the proper impedance for oscillation only in a narrow frequency band centered at the resonant frequency of the combining cavity. The spacing of these coaxial circuits around the combining cavity is not critical for producing single frequency CW oscillations free of spurious resonances. And, the above overall coaxial construction especially lends itself to a high packing density and to good heat sinking for the individual diodes. Furthermore, individual D.C. operating bias can be readily applied to each of the coaxial circuits; and these circuits may also be easily and individually tuned to the resonant frequency of the combining cavity.

It is, therefore, an object of the present invention to provide a new and improved microwave power accumulator for efficiently combining the output powers of a plurality of individual microwave sources.

Another object is to provide a power accumulator of the type described, characterized by a combining cavity which is a fundamental mode resonator and whose operation permits no spurious resonances.

Another object is to provide a microwave power accumulator of the type described which may be easily tuned by a single tuning adjustment and in which harmonics and spurious resonances are very effectively suppressed.

Another object is to provide a power accumulator of the type described whose novel construction lends itself to a high packing density and to good heat sinking properties.

Another object is to provide a power accumulator of the type described which does not require critical spacing of the individual oscillators therein relative to an output combining cavity.

Another object is to provide a power accumulator of the type described which is compact and light weight, economical of construction and reliable and durable in operation.

Another object is to provide a power accumulator of the type described which can also be fabricated as a strip line microwave integrated circuit or which may be operated either as a microwave power source (oscillator) or, in the alternative, used as an amplifier to replace traveling wave tubes.

A feature of the invention is the provision of a solid state power accumulator which, to date, has produced more continuous wave (CW) X-band power than any other known prior power accumulator.

DRAWINGS

Figure 1:
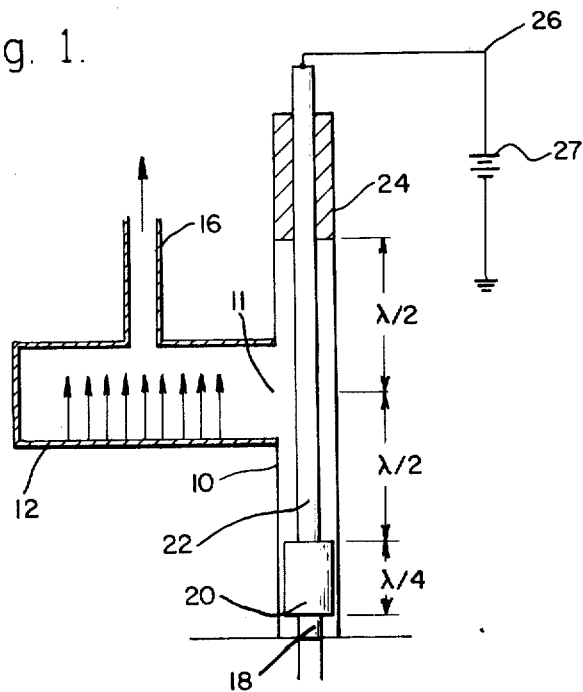
FIG. 1 is a schematic diagram of only one of the plurality coaxial oscillator circuits of the power accumulator embodying the invention. This diagram illustrates the connection of this oscillator circuit to a common combining cavity.

Referring now to FIG. 1, there is shown a coaxial oscillator circuit 10 which is integrally formed at the opening 11 with a central cylindrical waveguiding structure 12. The common cylindrical waveguiding structure 12 forms a resonant cavity for the oscillator circuit 10 and it has an opening 14 in the top wall thereof for coupling power out of the structure as will be further described below with reference to FIG. 3A. This output coupling from the resonant cavity 12 may be by way of a coaxial output connection 16 or by way of a waveguide output connection (not shown), the detailed structures for which are well-known in the art.

Each coaxial oscillator circuit 10 includes a microwave diode source 18, such as an impact avalanche transit time (IMPATT) diode, at one end of the circuit serially connected via transformer 20 to the center coaxial conductor 22 of the oscillator. IMPATT diodes are generally well-known in the microwave art and are described, for example, in detail in Sze, *Physics of Semiconductor Devices*, John Wiley & Sons, 1969, pages 200 et seq. The transformer 20 is a quarter wave ($\lambda/4$) impedance transformer which is coupled and via the coaxial inner conductor 22 to a cylindrical terminating absorber element 24 at the other end of the coaxial structure. The inner coaxial conductor 22 passes through the ferrite absorber 24 and extends outwardly from the coaxial structure 10 as shown and connects to a D.C. bias connection 26 for receiving a D.C. operating voltage from the supply 27. The cylindrical terminating member 24 is spaced as shown approximately one wavelength from the end of the quarter wave impedance transformer 20, and it suppresses spurious resonances and harmonics which would otherwise be reflected from this end of the coaxial circuit 10. Since the center of the opening 11 is approximately three-quarters of a wavelength ($3\lambda/4$) from the IMPATT diode 18, the necessary low to high impedance coupling is provided by the transformer 20 between the low impedance diode 18 and the opening 11 of the high impedance resonant cavity 12.

Figure 2:
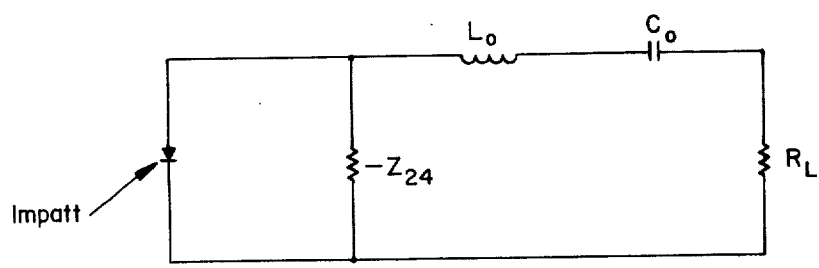
FIG. 2 is an equivalent circuit of FIG. 1.

Referring now to FIG. 2, there is shown the equivalent circuit of the coaxial oscillator 10. The equivalent inductance, $L_o$, and the equivalent capacitance, $C_o$, of the cavity 12 connect the 50 ohm impedance $Z_{24}$ of the termination element 24 to the 2 ohm impedance of the output load $R_L$. At circuit resonance, the reactance of $L_o$ and $C_o$ exactly cancel, so the 2 ohm load impedance $R_L$ is connected directly to the 2 ohm resistance of the diode 18, resulting in maximum power transfer in the circuit. The 50 ohm load $Z_{24}$ of the termination has little effect and absorbs very little power at resonance. When the cavity 12 is off resonance, the 50 ohm load $Z_{24}$ prevents the diode 18 from oscillating.

The combination of the $\lambda/4$ transformer 20, the cylindrical termination 24, and the exact wavelength ($\lambda$) spacings therebetween in the circuit 10 is believed novel in the art of microwave power accumulation and insures optimum and efficient circuit performance and single frequency CW operation. The latter is due in part to the one wavelength ($\lambda$) spacing between the closest edges of the two circuit elements 20 and 24 and the fact that the termination element 24 appears as a low impedance only to signals of wavelength λ, which corresponds to the resonant frequency of the cavity 12. Oscillations at this single CW frequency are enhanced, since the termination element 24 is seen by the diode as a large resistance at this cavity resonant frequency. At other frequencies, the termination element 24 appears to the diode as an impedance larger than the maximum negative resistance of diode impedance — a condition which will prevent oscillations at other frequencies. Therefore, the λ spacing between these elements 20 and 24, and the cylindrical shape of the termination element 24 provide the novel frequency selectivity of the invention.

Figure 3A:
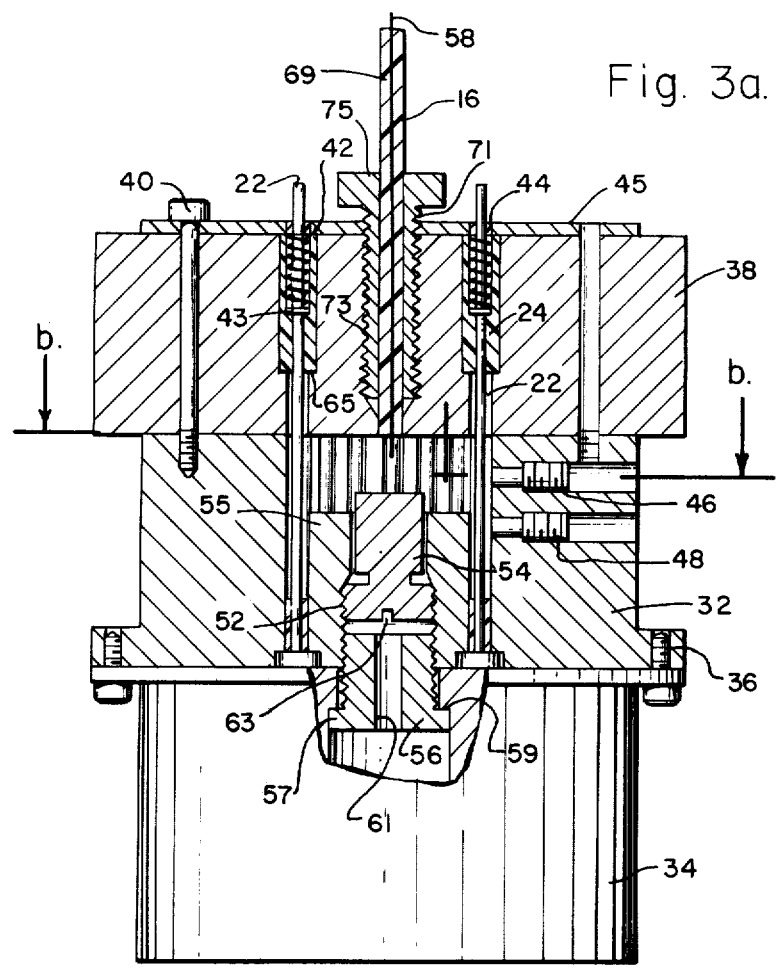
FIG. 3A is an elevational view, partly in cross-section, of a coaxial structure embodying the power accumulator and power accumulation concepts of the invention.
Figure 3B:
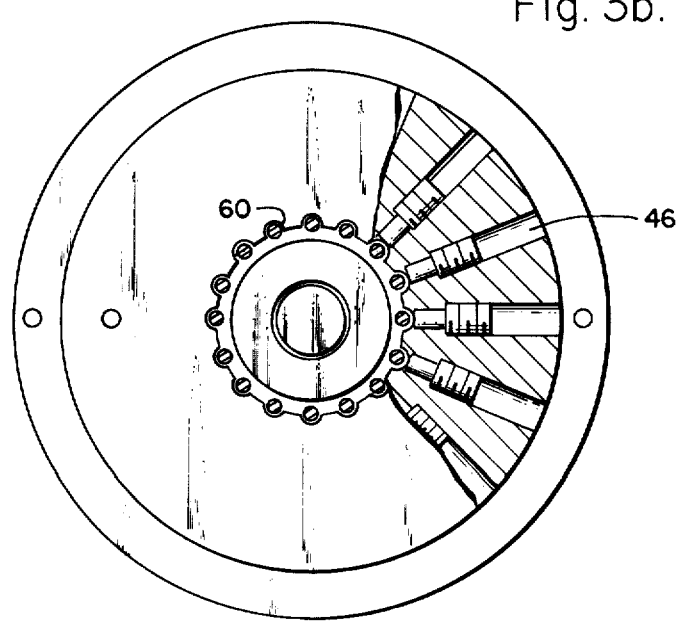
FIG. 3B is a cross-section plan view of FIG. 3A taken along lines B—B of FIG. 3A.

Referring now to FIGS. 3A and 3B, a plurality of the coaxial oscillator circuits 10 previously described are mounted as shown within an outer metal housing 32 and spaced symmetrically about the central axis thereof. The housing 32 may advantageously be made of aluminum and it is secured to a heat sink 34 by means of a plurality of screws 36. The heat sink 34 is of conventional metal construction and is provided with cooling ducts (not shown) for increasing the thermal dissipation capability of this structure. The metal housing 32 is further secured to a cylindrical metal cover 38 by means of additional screws 40 which extend vertically as shown into threaded engagement with the cylindrical housing 32.

Each of the coaxial oscillator circuits 10 has its inner conductor 22 spring biased by means of a coil spring 42 which is positioned as shown between a flange 43 on the conductor 22 and an insulating sleeve 44 in a top plate 45 of the cover 38. This spring biasing insures that good electrical contact is maintained at all times within each coaxial oscillator circuit 10. Each oscillator circuit 10 is also provided with a pair of reactive tuning screws 46 and 48 of conventional construction; and these tuning screws 46 and 48 may be individually adjusted to vary the shunt impedance of each coaxial oscillator circuit 10 and thereby provide a means for critically tuning each of the oscillator circuits 10 to the resonant frequency of the central combining cavity 12. Output tuning for the power accumulator is provided by means of a central tuning plunger 54 which is adjustably threaded as shown to a central portion 55 of the metal housing 32. This central tuning plunger 54 extends vertically as shown into the combining cavity 12. A locking screw 56 is coaxial with the tuning screw 54 and is threaded in the same opening of housing 55 as is the tuning screw 54. The lower end of the locking screw 56 has a shoulder portion 57 which fits tightly against an offset 59 wall in the heat sink 34. Thus, the locking screw 56 provides the central interlocking and support between the housing members 34 and 55. Further, an opening 61 is provided in the locking screw 56 so that the slot 63 of the tuning screw 54 is made accessible for tuning purposes.

The impedance, $Z_{24}$, of the hollow cylindrical ferrite termination member 24 is approximately one-half of the coaxial line impedance $Z_o$ (combined impedance of $L_o$ and $C_o$) as a result of the high dielectric constant of the ferrite. For frequencies at cavity resonance, the impedance discontinuity produced by both the ferrite material of member 24 and by the abrupt interface 65 at the lower end thereof serves to reduce the power absorbed by $Z_{24}$ at the fundamental resonant frequency and also to reflect harmonics of the fundamental frequency in the proper phase to enhance oscillations in the circuit. The above has the resultant effect of increasing the power delivered to $R_L$ at the fundamental frequency and suppressing oscillations "out of band" or shifted in frequency from the resonant frequency of the cavity 12.

FIG. 3B shows the uniform and symmetrical spacing of (16) coaxial oscillator circuits 10 within the metal housing 32. Each of the oscillator units is shown with the reactive tuning screw 46 through which the cross-section view in FIG. 3B is taken. Additionally, each coaxial oscillator circuit 10 is centrally positioned within a scalloped or semi-circular peripheral wall portion 60 of the outer accumulator housing 32. This scalloped wall geometry is a convenient construction for machining the coaxial circuits 10 in the common housing members 32 and 38 and provides a minimum amount of physical discontinuities in these housings and this minimizes the spurious resonances in the structure.

An output coupling probe or loop 58 is centrally positioned as shown within the output coaxial transmission line 16, and the coaxial line 16 includes a suitable insulating material 69 such as Teflon between the probe 58 and its outer conductor. The coaxial line is secured in its position shown in FIG. 3A by means of a hollow screw 71 which is threaded at 73 to the cover member 38 and which carries a hollow head 75 thereon for receiving the coaxial line 16 and for securing same in the vertical upright position shown. The coupling probe 58 provides a means for coupling microwave power out of the central resonant cavity 12. We have found that the output power for the power accumulation structure shown in FIG. 3A increases substantially linearly with an increase in the number of individual coaxial oscillator units 10 used. Thus, using 1 diode per each of 16 coaxial oscillator circuits, we have obtained an output power of approximately 15 watts CW at X band from 16 approximately 1 watt X band Hughes IMPATT diodes.

Many modifications may be made in the aforedescribed embodiment of the invention without departing from the true scope thereof. For example, the present invention is not limited to the use of IMPATT diodes, and may also be used with other power generating negative resistance devices, such as TRAPATT diodes, which are well-known in the art. Additionally, the invention is not limited to the use of a single diode per coaxial oscillator circuit. Instead, a plurality of diodes, when properly mounted and connected in a single coaxial oscillator circuit, may be utilized to replace the single diode 18 in each of the coaxial circuits 10. In using this latter proposed multiple diode configuration, care must be taken to position and connect the diodes in each coaxial oscillator circuit in a manner to prevent intolerable spurious resonances as a result of the interaction between the closely spaced diodes in a single circuit.

We claim:
1. A microwave power accumulator including, in combination:
 a. a plurality of coaxial circuits, each having a longitudinal axis of predetermined length and further having at least one solid state microwave diode at one end of said axis and a lossy termination element at the other end thereof, and conductor means connecting said diode and said element, said coaxial circuits operative to generate microwave power which is substantially free of spurious har- monics, b. a central power combining cavity being defined in part by a periphery enclosing a given space and having a central axis at the center of said periphery, c. said coaxial circuits positioned around said periphery of said cavity and having their longitudinal axes spaced an equal distance from said central axis of said cavity, d. said cavity further having an output port therein centrally disposed with respect to said coaxial circuits for receiving the combined power outputs from all of said coaxial circuits, and e. said diode in each coaxial circuit being electromagnetically coupled to said cavity, and the resonance of said cavity causing the oscillation of said coaxial circuits at a predetermined frequency.

2. The power accumulator defined in claim 1 wherein said diodes are impact avalanche transit time (IMPATT) diodes.

3. The power accumulator defined in claim 1 wherein each of said coaxial circuits includes a quarter wave ($\lambda/4$) impedance transformer coupling each diode to a central coaxial conductor in each of said circuits.

4. The power accumulator defined in claim 1 wherein said combining cavity is spaced an odd multiple of $\lambda/4$ from said diodes, where $\lambda$ is the wavelength corresponding said predetermined frequency, said cavity providing efficient coupling of the power output from said coaxial circuits to an output load.

5. The power accumulator defined in claim 3 wherein said termination element is a solid ferrite cylinder, having one end thereof spaced a multiple of $\lambda/2$ from said quarter wave impedance transformer, where $\lambda$ is the wavelength corresponding to said predetermined frequency, said termination element enhancing oscillation at the resonant frequency of said cavity and suppressing all other harmonic modes of oscillation in each coaxial circuit.

6. The power accumulator defined in claim 1 wherein said coaxial circuits are mounted in scalloped semicylindrical recesses in a housing at the periphery of said cavity to thereby insure optimum additive coupling of microwave energy from each of said coaxial circuits to said combining cavity.

7. The power accumulator defined in claim 6 wherein said combining cavity is spaced an odd multiple of $\lambda/4$ from diodes in each coaxial circuit, where $\lambda$ is the wavelength corresponding to said predetermined frequency, said cavity providing efficient coupling of power from the individual coaxial circuits to an output load.

8. The power accumulator defined in claim 7 wherein said diodes are impact avalanche transist time (IMPATT) diodes.

9. The power accumulator defined in claim 8 wherein:

a. each of said coaxial circuits includes a quarter wave ($\lambda/4$) impedance transformer which couples said diodes in each circuit to said cavity, and b. said termination element is a ferrite cylinder with the end thereof spaced a multiple of $\lambda/2$ from said quarter wave impedance transformer, where is the wavelength corresponding to said predetermined frequency, said termination element enhancing oscillation at the resonant frequency of said cavity and suppressing other harmonic modes of oscillation in each coaxial circuit.

10. A microwave power accumulator comprising:

a. a plurality of negative resistance electromagnetic oscillator circuits each capable of producing both microwave and millimeter wave power and each tuned to couple a power output signal to an output port thereof substantially free of spurious harmonics, b. a central power combining cavity including spaced apart top and bottom walls having outer edges thereof joined to said plurality of negative resistance electromagnetic circuits at the respective output ports thereof and enclosing a region of predetermined volume which defines a central electromagnetic wave propagating region, and c. said top wall having a centrally disposed output port therein from which the combined power outputs from all of said negative resistance electromagnetic oscillator circuits are derived.

11. The power accumulator defined in claim 10 wherein said output port in said top wall lies on the central axis of said electromagnetic wave propagating region, and said plurality of said negative resistance electromagnetic circuits all have longitudinal axis spaced an equal distance from the central axis of said electromagnetic wave propagating region.

12. The power accumulator defined in claim 10 wherein each of said electromagnetic circuits includes an impact avalanche transit time (IMPATT) diode.

13. The power accumulator defined in claim 12 wherein each of said electromagnetic circuits includes a quarter wave ($\lambda/4$) impedance transformer coupling each IMPATT diode to a central coaxial conductor in each of said electromagnetic circuits and to an output port therefor.

14. The power accumulator defined in claim 12 wherein said electromagnetic wave propagating region is spaced an odd multiple of $\lambda/4$ from said diodes, where $\lambda$ is the length of the waves propagated in said central electromagnetic wave propagating region, and said region providing efficient coupling of power output from each of said electromagnetic circuits to said output port in said top wall.

15. The power accumulator defined in claim 13 which further includes a termination element comprised of a solid-ferrite cylinder at one end of said electromagnetic circuits opposite to said diode therein, with the one end of said cylinder spaced a multiple of $\lambda/2$ from said quarter wave impedance transformer, where $\lambda$ is the wavelength of waves propagated in said central electromagnetic wave propating region, said termination element enhancing the oscillation of said electromagnetic circuits at the resonant frequency of said electromagnetic wave propagating region and operative to suppress other harmonic modes of oscillation in each electromagnetic circuit.

* * * * *